US 8,664,744 B2

(12) United States Patent
Tani et al.

(10) Patent No.: US 8,664,744 B2
(45) Date of Patent: Mar. 4, 2014

(54) ANTI-FUSE ELEMENT WITHOUT DEFECTIVE OPENS

(75) Inventors: Shinsuke Tani, Kyoto-Fu (JP);
Toshiyuki Nakaiso, Kyoto-fu (JP)

(73) Assignee: Murata Manufacturing Co., Ltd., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 13/354,637

(22) Filed: Jan. 20, 2012

(65) Prior Publication Data

US 2012/0112313 A1 May 10, 2012

Related U.S. Application Data

(63) Continuation of application No. PCT/JP2010/062377, filed on Jul. 22, 2010.

(30) Foreign Application Priority Data

Jul. 22, 2009 (JP) .................................. 2009-171194

(51) Int. Cl.
*H01L 23/52* (2006.01)
(52) U.S. Cl.
USPC .................................. 257/530; 257/E23.147
(58) Field of Classification Search
USPC .......................................... 257/530, E23.147
See application file for complete search history.

(56) References Cited

U.S. PATENT DOCUMENTS

| | | | | |
|---|---|---|---|---|
| 4,823,181 A | * | 4/1989 | Mohsen et al. | 257/530 |
| 4,899,205 A | * | 2/1990 | Hamdy et al. | 257/530 |
| 5,134,457 A | * | 7/1992 | Hamdy et al. | 257/530 |
| 5,196,724 A | * | 3/1993 | Gordon et al. | 257/530 |
| 5,266,829 A | * | 11/1993 | Hamdy et al. | 257/530 |
| 5,412,244 A | * | 5/1995 | Hamdy et al. | 257/530 |
| 5,451,811 A | * | 9/1995 | Whitten et al. | 257/530 |
| 5,557,136 A | * | 9/1996 | Gordon et al. | 257/530 |
| 5,759,876 A | * | 6/1998 | Singlevich et al. | 438/131 |
| 5,929,505 A | * | 7/1999 | Takagi et al. | 257/530 |
| 5,937,281 A | * | 8/1999 | Wu | 438/131 |
| 6,069,064 A | * | 5/2000 | Cutter et al. | 438/600 |

(Continued)

FOREIGN PATENT DOCUMENTS

| | | |
|---|---|---|
| JP | 08078532 | 3/1996 |
| JP | 10084044 | 3/1998 |

(Continued)

OTHER PUBLICATIONS

Written Opinion of the International Searching Authority dated Oct. 19, 2010.

*Primary Examiner* — Kimberly Rizkallah
*Assistant Examiner* — Caleb Henry
(74) *Attorney, Agent, or Firm* — Dickstein Shapiro LLP

(57) ABSTRACT

An anti-fuse element that includes an insulation layer; a pair of electrode layers on the upper and lower surfaces of the insulation layer; and an extraction electrode formed so as to make contact with a section of the electrode layers that form electrostatic capacitance with the insulation layer. The anti-fuse element is configured to create a structural change section including short circuit sections that are short-circuited such that the pair of electrode layers are fused mutually to engulf the insulation layer, and a dissipation section with the electrode layers and insulation layer dissipated by engulfing the insulation layer, when a voltage not less than the breakdown voltage of the insulation layer is applied. Furthermore, the extraction electrode has at least two or more sections in contact with the electrode layer.

10 Claims, 7 Drawing Sheets

(56) References Cited

U.S. PATENT DOCUMENTS

| | | | |
|---|---|---|---|
| 6,081,021 A * | 6/2000 | Gambino et al. | 257/530 |
| 6,159,836 A | 12/2000 | Wei | |
| 6,288,437 B1 * | 9/2001 | Forbes et al. | 257/530 |
| 6,429,503 B2 * | 8/2002 | Lehr et al. | 257/530 |
| 6,498,056 B1 * | 12/2002 | Motsiff et al. | 438/131 |
| 6,525,399 B2 * | 2/2003 | Cutter et al. | 257/530 |
| 6,596,592 B2 * | 7/2003 | Bertin et al. | 438/270 |
| 6,603,187 B1 * | 8/2003 | Zhang et al. | 257/530 |
| 6,617,233 B2 * | 9/2003 | Hsieh et al. | 438/600 |
| 6,674,131 B2 * | 1/2004 | Yokogawa et al. | 257/379 |
| 6,819,592 B2 * | 11/2004 | Noguchi et al. | 365/185.17 |
| 6,835,575 B2 * | 12/2004 | Chen | 438/1 |
| 7,023,070 B2 * | 4/2006 | Kato | 257/529 |
| 7,378,718 B2 | 5/2008 | Tsutsui | |
| 7,674,691 B2 | 3/2010 | Cestero et al. | |
| 7,884,553 B2 | 2/2011 | Wada et al. | |
| 8,183,665 B2 * | 5/2012 | Bertin et al. | 257/529 |
| 8,242,486 B2 * | 8/2012 | Fujii | 257/40 |
| 2003/0062596 A1 * | 4/2003 | Hawley et al. | 257/530 |
| 2004/0004269 A1 * | 1/2004 | Fifield et al. | 257/530 |
| 2008/0012057 A1 * | 1/2008 | Fukuzumi et al. | 257/296 |
| 2008/0099878 A1 * | 5/2008 | Yukawa et al. | 257/530 |
| 2008/0116500 A1 * | 5/2008 | Tokunaga | 257/314 |
| 2008/0144355 A1 * | 6/2008 | Boeve et al. | 365/148 |
| 2008/0185723 A1 * | 8/2008 | Moriwaki | 257/758 |
| 2008/0224229 A1 * | 9/2008 | Tajima et al. | 257/379 |
| 2009/0321735 A1 | 12/2009 | Cestero et al. | |

FOREIGN PATENT DOCUMENTS

| | | |
|---|---|---|
| JP | 10116909 | 5/1998 |
| JP | 2003068854 | 3/2003 |
| JP | 2006013338 | 1/2006 |
| JP | 2007329275 | 12/2007 |
| WO | WO-2008109654 | 9/2008 |

* cited by examiner

ANTI-FUSE ELEMENT WITHOUT DEFECTIVE OPENS

CROSS REFERENCE TO RELATED APPLICATIONS

The present application is a continuation of International application No. PCT/JP2010/062377, filed Jul. 22, 2010, which claims priority to Japanese Patent Application No. 2009-171194, filed Jul. 22, 2009, the entire contents of each of which are incorporated herein by reference.

FIELD OF THE INVENTION

The present invention relates to an anti-fuse element.

BACKGROUND OF THE INVENTION

Common fuses are blown out at a predetermined voltage or more to interrupt current. On the contrary, anti-fuse elements have been proposed which are short-circuited to cause a current to flow when a voltage not less than a certain value is applied.

Liquid crystal display devices and various types of lighting devices are equipped with a large number of light-emitting diodes (LED: Light Emitting Diode) as light-emitting sources. In addition, in recent years, various types of electric appliances have electronic circuit boards mounted with a large number of Zener diodes and varistors. In a circuit of these electronic components connected in series with each other, an anti-fuse element is used in electrically parallel connection with each electronic component.

This anti-fuse element is in an insulating state when the electronic components operate normally. When a specific electronic component undergoes disconnection to cause a defective open due to the end of the life or the like, the anti-fuse element is short-circuited into a conducting state. Then, the other electronic components can be avoided from the stop of the operation.

For example, Patent Document 1 discloses an anti-fuse element which is connected in parallel with each of a plurality of LEDs, and provided with low melting point conductors with a predetermined melting point in the vicinity of terminals on each of positive and negative electrode sides. Furthermore, a light-emitting diode lighting circuit is disclosed in which when the LED causes a defective open, the low melting point conductors provided on the anti-fuse element connected in parallel with the LED connect through electric contact between the both terminals.

In Patent Document 1, as shown in FIG. 8(*a*), an anti-fuse element 101 includes an insulator 103 with a resistive element 102 provided thereon by overcoating or printing, terminals 104, 105 provided on both sides of the insulator 103 and connected to positive and negative electrode sides of the resistive element 102, and low melting point conductors 106, 107 formed on each connection between the insulator 103 and the terminals 104, 105, and in the vicinity of the connection, so as to be fused at a predetermined temperature.

When the LEDs operate normally, the low melting point conductors 106, 107 are separated from each other as shown in FIG. 8(*a*), and the anti-fuse element 101 thus keeps an electrically insulating state. On the other hand, when the LED causes a defective open due to disconnection or the like, an electric current flows through the anti-fuse element 101. Then, Joule heat is generated in the resistive element 102, and transferred through the insulator 103 to the low melting point conductors 106, 107. As a result, as shown in FIG. 8(*b*), the low melting point conductors 106, 107 are fused and joined to electrically connect the terminals 104, 105 to each other into a conducting state, and an electric current flows through the anti-fuse element 101 around the LED. This configuration allows, even when some of the LEDs undergo defective opens, the other LEDs connected in series with each other to light normally.

Patent Document 1: Japanese Patent Application Laid-Open No. 2007-329275

SUMMARY OF THE INVENTION

In the case of the anti-fuse element 101 in Patent Document 1, the low melting point conductors 106, 107 are fused, and joined with each other, when the LED undergoes a defective open. Therefore, an electric current can be applied with a low resistance in a stable manner. However, when the resistive element 102 has a low resistance value, an electric current also flows through the resistive element 102 during the normal operation. Therefore, there is a possibility that the amount of current flowing through the LEDs may decreased to reduce the amount of luminescence from the LEDs.

On the other hand, when the resistive element 102 has a high resistance value, only a minute electric current flows through the anti-fuse element 101 during the normal operation, thus ensuring the amount of luminescence from the LEDs. However, when the LED undergoes a defective open, there is a need to supply, to the resistive element 102, a sufficient electric current for heat generation. Accordingly, a power supply unit which is large in power capacity is required, which may lead to an increase in cost.

Thus, the inventors have proposed, in order to overcome the drawbacks of the prior art, an anti-fuse element including an insulation layer, a pair of electrode layers formed on upper and lower surfaces of the insulation layer, and a pair of extraction electrodes formed so as to make contact with the pair of electrode layers, as in Japanese Patent Application No. 2008-118293.

In the case of this anti-fuse element, when a voltage not less than the breakdown voltage of the insulation layer is applied, the pair of electrode layers will be fused by generated Joule heat, and connected to each other, thereby achieving a stable short circuit state. This configuration causes a structural change section including short circuit sections short-circuited in such a way that the electrode layers engulf the insulation layer, and a dissipation section with the insulation layer and electrode layers dissipated by engulfing the insulation layer.

If the structural change section is formed immediately below a section of the extraction electrode in contact with the electrode layer, there is fear that a defective open may be caused between the extraction electrode and the electrode layer. More specifically, the anti-fuse element may fail to achieve a desirable short circuit state.

The present invention has been made in view of the circumstances, and an object of the present invention is to provide an anti-fuse element which cause no defective open as described above, when a voltage not less than the breakdown voltage of an insulation layer is applied to cause short circuit.

An anti-fuse element according to the present invention includes: an insulation layer; a pair of electrode layers formed on upper and lower surfaces of the insulation layer; and an extraction electrode formed so as to make contact with a section of the electrode layer for forming electrostatic capacitance with the insulation layer, the anti-fuse element configured to cause a structural change section including short circuit sections short-circuited in such a way that the pair of electrode layers are fused mutually to engulf the insulation layer, and a dissipation section with the electrode layers and insulation layer dissipated by engulfing the insulation layer, when a voltage not less than the breakdown voltage of the insulation layer is applied, characterized in that the extraction electrode has at least two or more sections in contact with the electrode layer.

In accordance with this configuration, even if the structural change section is caused immediately below one of the multiple sections of the extraction electrode in contact with the electrode layer, the other section will be left without being involved in the structural change section. Accordingly, the applied current is maintained between the extraction electrode and the electrode layer, and the anti-fuse element thus has no defective open caused.

In addition, in the anti-fuse element according to the present invention, the distance between the contact sections is preferably larger than the maximum diameter of the structural change section.

In this case, any of the two or more contact sections will be left with certainty, without being involved in the structural change section.

In addition, the anti-fuse element according to the present invention preferably includes a protective layer for covering the insulation layer and the pair of electrode layers.

In this case, the presence of the protective layer can prevent the ingress of moisture into the insulation layer and the pair of electrode layers.

In addition, in the anti-fuse element according to the present invention, the extraction electrode includes a connection which is connected to the electrode layers through the protective layer, and a planar section which is formed on the protective layer.

In this case, the extraction electrode including the planar section facilitates the connection to external electrodes.

In addition, the anti-fuse element according to the present invention includes: a substrate; and an external electrode electrically connected to the extraction electrode, wherein the insulation layer, the pair of electrode layers, and the external electrode are formed on one principal surface side of the substrate.

In this case, the anti-fuse element is easily manufactured, which easily provides an external electrical connection.

In addition, in the anti-fuse element according to the present invention, preferably, the insulation layer has a material of $(Ba,Sr)TiO_3$, and the electrode layers have a material of a metal or an alloy thereof including at least one element selected from the group consisting of Au, Ag, Pt, Pd, Rh, Ir, Ru, and Os.

In this case, it is possible to design the anti-fuse element so that insulation breakdown is ensured in a preferable voltage range, while the anti-fuse element has resistance to voltages applied momentarily, such as static electricity in the case of mounting. In addition, the low resistance can be also maintained after the short circuit is caused.

The anti-fuse element according to the present invention is characterized in that the extraction electrode has at least two or more sections in contact with the electrode layer. Therefore, even if the structural change section is caused immediately below one of the multiple sections of the extraction electrode in contact with the electrode layer, the other section will be left without being involved in the structural change section. Accordingly, the applied current is maintained between the extraction electrode and the electrode layer, and the anti-fuse element thus has no defective open caused.

DETAILED DESCRIPTION OF THE INVENTION

An embodiment of the present invention will be described below.

Figure 1:
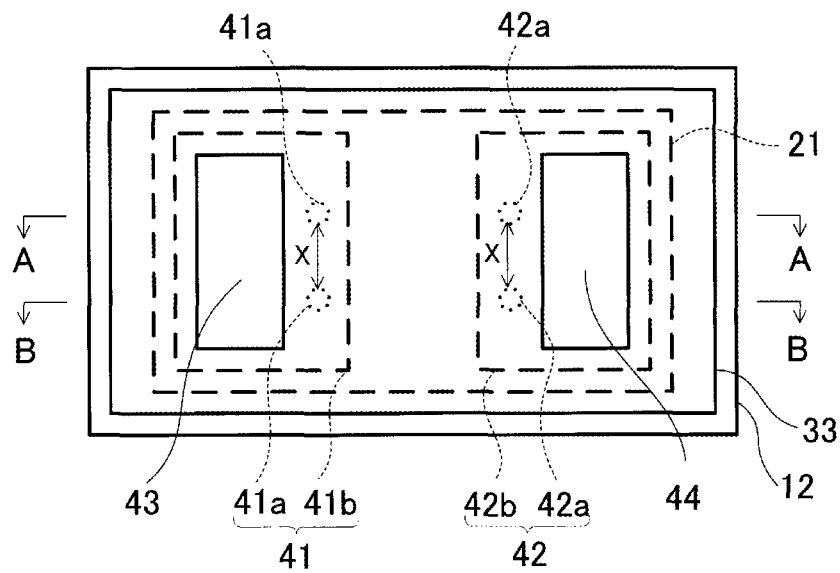
FIG. 1 is a plan view illustrating an embodiment of an anti-fuse element according to the present invention.

FIG. 1 is a plan view of an anti-fuse element according to the present invention. As shown in FIG. 1, the upper surface of an anti-fuse element 10 is covered with an organic insulation layer 33. Furthermore, external electrodes 43, 44 are exposed at the surface of the anti-fuse element 10.

Figure 2:
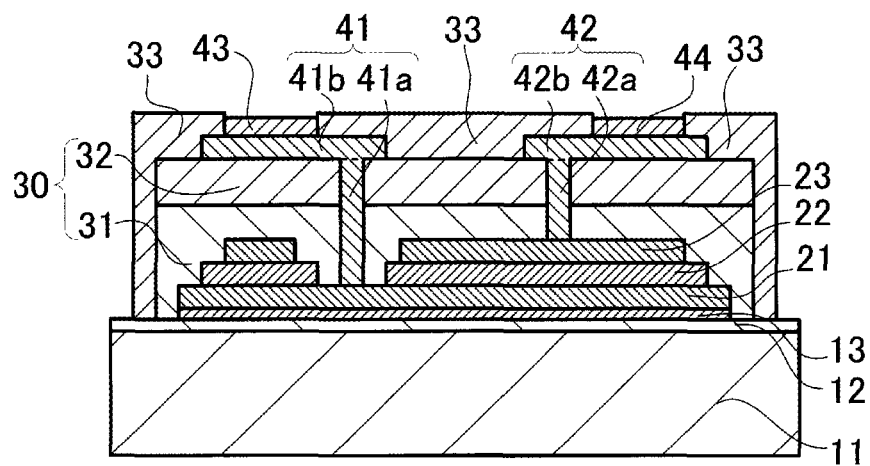
FIG. 2 is a cross-sectional view along the lines A-A and B-B of FIG. 1.

FIG. 2 is a cross-sectional view along the lines A-A and B-B of FIG. 1. In the present embodiment, the both cross sections have the same structure. The anti-fuse element 10 is formed on a substrate 11, for example, with the use of a thin-film formation process. Materials for the substrate 11 include, for example, a Si single-crystalline substrate. Further, an oxide layer 12 is preferably formed on the surface of the substrate 11. The oxide layer 12 is formed by, for example, subjecting the substrate 11 to a heat treatment.

An adhesion layer 13, a lower electrode layer 21, an insulation layer 22, and an upper electrode layer 23 are sequentially stacked on the oxide layer 12.

The adhesion layer 13 is formed to ensure the adhesion between the substrate 11 and the lower electrode layer 21. While the adhesion layer 13 may be the same material as, or a different material from the insulation layer 22, the manufacture is simple in the case of the same material.

As the material of the insulation layer 22, such a material is selected that undergoes insulation breakdown to enable short circuit between the lower electrode layer 21 and the upper electrode layer 23 when the voltage applied between the lower electrode layer 21 and the upper electrode layer 23 reaches a certain value (breakdown voltage) or more. In order to meet the requirement, the material of the insulation layer 22 can include, for example, $TiO_2$ with a dielectric constant on the order of 100, $(Ba,Sr)TiO_3$ with a dielectric constant on the order of 400, and a $Pb(Zr,Ti)O_3$ with a dielectric constant on the order of 1000. In particular, when the material of the insulation layer 22 is $(Ba,Sr)TiO_3$, it is possible, and preferable to design the anti-fuse element so that insulation breakdown is ensured in a preferable voltage range, while the anti-fuse element has resistance to voltages applied momentarily, such as static electricity in the case of mounting.

The lower electrode layer 21 is formed on the lower surface of the insulation layer 22. In addition, the upper electrode layer 23 is formed on the upper surface of the insulation layer 22. Conductive metallic materials are used for the lower electrode layer 21 and the upper electrode layer 23. After short circuit is caused, an electric current will flow through the anti-fuse element 10 for a long period of time. Even in that case, it is preferable to use noble metals for the lower electrode layer 21 and the upper electrode layer 23, in order to prevent trouble such as an increase in resistance due to oxidation. For example, the noble metals are preferably a metal or an alloy thereof including at least one element selected from the group consisting of Au, Ag, Pt, Pd, Rh, Ir, Ru, and Os.

The protective layer 30 is formed so as to cover the adhesion layer 13, the lower electrode layer 21, the insulation layer 22, and the upper electrode layer 23. The protective layer 30 is formed to prevent the ingress of moisture into, for example, the lower electrode layer 21, the insulation layer 22, and the upper electrode layer 23. In the present embodiment, the protective layer 30 includes an inorganic protective layer 31 and an organic protective layer 32. The material of the inorganic protective layer 31 can include, for example, $SiN_x$, $SiO_2$, $Al_2O_3$, and $TiO_2$. In addition, the material of the organic protective layer 32 can include, for example, a polyimide resin and an epoxy resin.

An extraction electrode 41 is formed in contact with the lower electrode layer 21. Furthermore, the extraction electrode 41 includes a connection 41a and a planar section 41b. The connection 41a is connected to the lower electrode layer 21 through the protective layer 30. In addition, the planar section 41b is formed on the protective layer 30.

An extraction electrode 42 is formed in contact with a portion of the upper electrode layer 23 which forms electrostatic capacitance with the insulation layer 22, that is, a region of the upper electrode layer 23 which is opposed to the lower electrode layer 21 with the insulation layer 22 interposed therebetween. Furthermore, the extraction electrode 42 includes a connection 42a and a planar section 42b. The connection 42a is connected to the upper electrode layer 23 through the protective layer 30. In addition, the planar section 42b is formed on the protective layer 30.

As is also clear from FIG. 1, the extraction electrode 41 has two sections in contact with the lower electrode layer 21. More specifically, the extraction electrode 41 has two connections 41a. Furthermore, the distance between the two connections 41a is denoted by X.

Likewise, the extraction electrode 42 has two sections in contact with the upper electrode layer 23. More specifically, the extraction electrode 42 has two connections 42a. Furthermore, the distance between the two connections 42a is denoted by X.

An external electrode 43 is electrically connected to the extraction electrode 41. In addition, an external electrode 44 is electrically connected to the extraction electrode 42. Furthermore, the lower electrode layer 21, the insulation layer 22, the upper electrode layer 23, and the external electrodes 43, 44 are preferably formed on one principal surface side of the substrate 11. This is because, in this case, the anti-fuse element is easily manufactured, which easily provides an external electrical connection.

The organic insulation layer 33 is formed to cover the inorganic protective layer 31 and the organic protective layer 32. Furthermore, the organic insulation layer 33 is formed so that the external electrodes 43, 44 are exposed at the surface of the anti-fuse element 10. Sealing can be achieved with the organic insulation layer 33, even when delamination is caused due to short circuit between the lower electrode layer 21 and the upper electrode layer 23. Therefore, an electric current also flows through the anti-fuse element in a stable manner after short circuit is caused. The material of the organic insulation layer 33 can include, for example, a polyimide resin and an epoxy resin.

It is to be noted that while the insulation layer 22 has a one-layer structure in FIG. 2, the insulation layer 22 may have multiple insulation layers. In that case, the respective insulation layers and pairs of electrode layers present on and under the insulation layers will form multiple electrostatic capacitance components. In that case, the extraction electrode may be provided so that the electrode layers present on and under the multiple insulation layers are electrically connected to the external electrode. Depending on where the extraction electrode is formed, it is possible to connect the multiple electrostatic capacitance components derived from the respective insulation layers in parallel with each other.

In addition, an insulation layer of the same type of material as the insulation layer 22 may be further provided on the upper electrode layer 23. In this case, the leakage current can be reduced.

Next, with the case of the anti-fuse element according to the present invention connected electrically in parallel with electronic components, the mechanism will be described for the case of changing the anti-fuse element from an insulating state to a short-circuit state. FIGS. 3(a) to 3(d) are cross-sectional views schematically illustrating the adhesion layer 13, the lower electrode layer 21, the insulation layer 22, and the upper electrode layer 23.

Figure 3A:
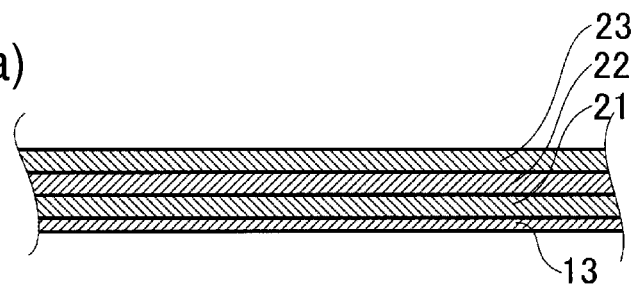
FIGS. 3(a) to 3(d) are schematic diagrams illustrating a mechanism for the case of changing the anti-fuse element according to the present invention from an insulating state to a short-circuit state.

FIG. 3(a) is a cross-sectional view of a state with a normally operating electronic component. In this state, the lower electrode layer 21 and the upper electrode layer 23 are insulated from each other with the insulation layer 22 interposed therebetween.

Figure 3B:
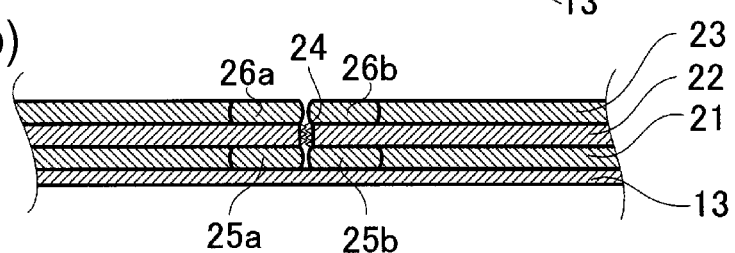

FIG. 3(b) is a diagram of a state in which a voltage not less than the breakdown voltage of the insulation layer 22 is applied to the anti-fuse element, thereby causing insulation breakdown. When the electronic component is brought into an open state due to disconnection or the like, a voltage is applied to the anti-fuse element, and an electric current temporarily flows into the lower electrode layer 21, the insulation layer 22, and the upper electrode layer 23. This electric current generates Joule heat, and this heat generation fuses the lower electrode layer 21 and the upper electrode layer 23 to form balls. The lower electrode layer 21 is fused to form balls 25a, 25b. In addition, the upper electrode layer 23 is fused to form balls 26a, 26b. Then, the insulation layer 22 causes a crack 24 therein.

Figure 3C:
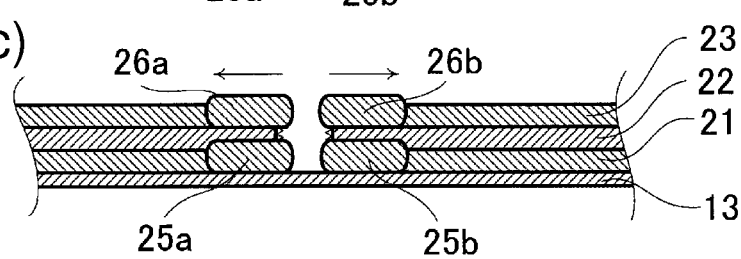

FIG. 3(c) is a diagram of a state in which the lower electrode layer 21 and upper electrode layer 23 are fused progressively. Because an electric current continues to flow into the lower electrode layer 21, the insulation layer 22, and the upper electrode layer 23, the lower electrode layer 21 and the upper electrode layer 23 are fused progressively with the passage of time. The formed balls 25a, 25b, 26a, 26b are swollen in the direction of an arrow. Then, the insulation layer 22 is divided completely.

Figure 3D:
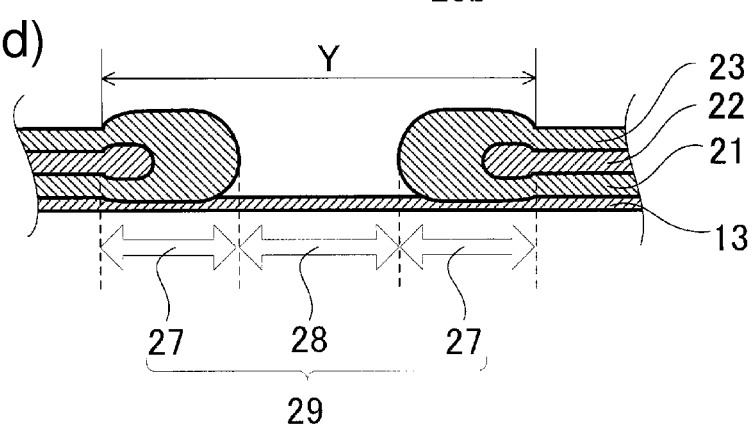

FIG. 3(d) is a diagram of a further fused state with a structural change section 29 caused. The further progressed fusing causes the structural change section 29 including short circuit sections 27 short-circuited in such a form that engulfs the insulation layer 22, and a dissipation section 28 with the lower electrode layer 21, insulation layer 22, and upper electrode layer 23 dissipated by engulfing the insulation layer 22.

In the short circuit sections 27, when the formed balls 25a, 25b, 26a, 26b are swollen progressively, the swollen balls are formed in a manner such that the balls together engulfs the divided insulation layer 22. The short circuit sections 27 are formed in a manner that involves not only the lower electrode layer 21 and the upper electrode layer 23, but also the insulation layer 22. As long as the lower electrode layer 21 and the upper electrode layer 23 are electrically connected to each other in any portion of the short circuit section 27, the lower electrode layer 21 and the upper electrode layer 23 will be brought into a short circuit state.

Thereafter, the heat generated by applying a current is reduced to lower the temperature, so that a high current will flow through the anti-fuse element.

Figure 4:
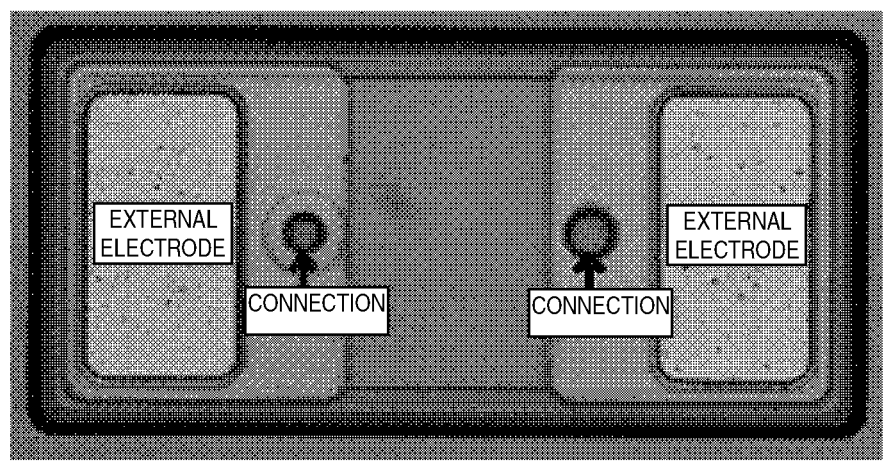
FIG. 4 is a planar photograph of the anti-fuse element according to the present invention before the anti-fuse element is short-circuited.

FIG. 4 is a planar photograph of the anti-fuse element before the anti-fuse element is short-circuited. FIG. 4 corresponds to the plan view of FIG. 1. The external electrodes are exposed at the surface of the anti-fuse element. In addition, the extraction electrodes each include the connection and the planar section, and the circular sections in the figure correspond to the connections of the extraction electrodes. It is to be noted that while FIG. 4 differs from FIG. 1 in that the extraction electrodes each have one connection, it is considered that structural change sections are produced in the same way even when the extraction electrodes each have multiple connections.

Figure 5:
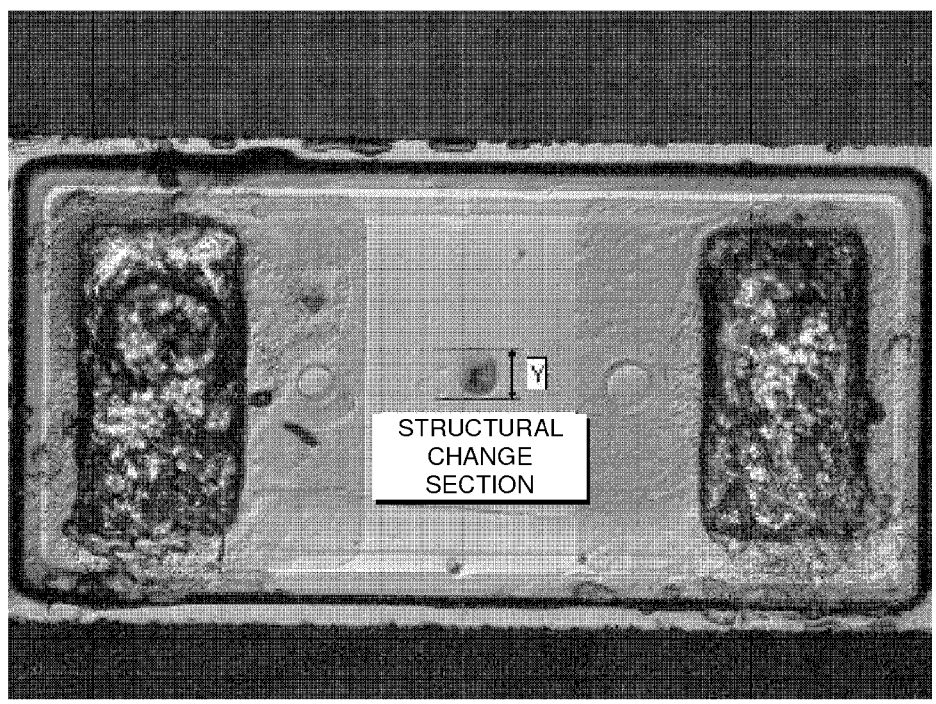
FIG. 5 is a planar photograph of the anti-fuse element according to the present invention after the anti-fuse element is short-circuited.

FIG. 5 is a planar photograph of the anti-fuse element after the anti-fuse element is short-circuited. In this anti-fuse element, it can be seen that the structural change section is caused near the center of the anti-fuse element. In addition, it can be seen that the structural change section typically has a nearly circular shape as viewed from above the anti-fuse element. As in FIG. 5, the maximum diameter of the structural change section is denoted by Y. FIG. 3(d) corresponds to a cross section of the structural change section in FIG. 5. More specifically, the dissipation section 28 in FIG. 3(d) is formed near the center of the structural change section. Furthermore, the short circuit sections 27 are formed in an annular shape near the ends of the structural change section. It is to be noted that the boundaries between the short circuit sections 27 and the dissipation section 28 may be vague in many cases. In addition, the maximum diameter in this specification represents the maximum length of a line segment drawn between two points on the circumference of a portion, when the section is two-dimensionally measured.

There is a possibility that the structural change section caused in the short-circuited anti-fuse element may be caused in any region where the lower electrode layer, the insulation layer, and the upper electrode layer form electrostatic capacitance. Therefore, if the structural change section is caused immediately below the connection of the extraction electrode, there is fear that the connection will be involved in the structural change section to cause a defective open in the anti-fuse element itself.

The inventor has confirmed that the maximum diameter of the structural change section will not vary significantly for each short circuit, but has reproducibility to some extent. More specifically, it has been confirmed that the maximum diameter of the structural change section falls within a certain range by determining design factors such as the materials and thicknesses of the insulation layer and electrode layers, and the amount of current flowing in during the operation of the anti-fuse element.

The anti-fuse element according to the present invention is characterized in that the extraction electrode has at least two or more sections in contact with the electrode layer. In the present embodiment, the extraction electrode includes two connections in parallel with each other. In accordance with this configuration, even if the structural change section is caused immediately below one of the connections of the extraction electrode, the other connection will be left without being involved in the structural change section. Accordingly, the short circuit is maintained between the upper and lower electrode layers. As a result, an electric current flows in a stable manner through the short-circuited anti-fuse element with no defective open caused.

In addition, the distance between the contact sections is preferably larger than the maximum diameter of the structural change section. More specifically, the dimension of X in FIG. 1 is preferably larger than the dimension of Y in FIGS. 3(d) and 5. In this case, even if the structural change section is caused immediately below one of the connections of the extraction electrode, the other connection will be left with more certainty, without being involved in the structural change section. It is to be noted that in the case of three or more contact sections, the distance between the contact sections refers to the largest value among the distances between the contact sections.

The maximum diameter or area of the structural change section is correlated with the amount of current flowing into the anti-fuse element when the electronic component undergoes a defective open. This amount of current is determined by the applied voltage and a resistor connected in series with the anti-fuse element. In accordance with the Joule's law, the heat generation in short circuit is proportional to the square of the amount of current. Therefore, as the amount of current flowing in is increased, the amount of heat generation will be increased, and the maximum diameter and area of the structural change section will be thus increased.

It is to be noted that the maximum diameter and area of the structural change section are obtained as follows. More specifically, a plurality of anti-fuse elements are short-circuited under certain conditions supposed during the operation of the anti-fuse elements to two-dimensionally measure structural change sections. Then, among the measured values, the maximum value is regarded as the maximum value and area of the structural change section.

In addition, while an example of the circular connection of the extraction electrode in cross section has been described in the present embodiment, the cross section may be not only circular, but also polygonal such as triangle and rectangular. In that case, the maximum diameter represents the longest distance between the vertices of the polygon.

The use of the anti-fuse element according to the present invention allows, even when some of multiple electronic components connected in series with each other break down into an open state, the other electronic components to continue to operate normally. Moreover, when the electrode layers formed from a high-melting-point noble metal material such as Pt or Au are short-circuited by fusing and welding with each other, the low resistance can be maintained without any oxidation or increase in resistance even due to the fusing. Accordingly, a power source which is large in power capacity is also not required.

EXPERIMENTAL EXAMPLE

Under the following conditions, an anti-fuse element was prepared with each extraction electrode including one connection of 30 μm in diameter. An explanation will be given with reference to FIGS. 6(a) to 6(d) and 7(e) to 7(g). It is to be noted that the drawings are schematically illustrated for the sake of easy understanding.

Figure 6A:
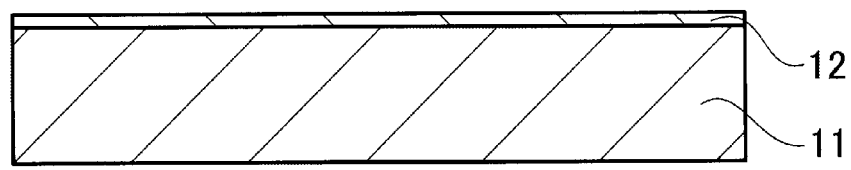
FIGS. 6(a) to 6(d) are cross-sectional views illustrating steps of manufacturing an anti-fuse element according to the present invention. (Experimental Example)

First of all, as shown in FIG. 6(a), a substrate 11 was prepared with an oxide layer 12 formed. Specifically, a Si single crystalline substrate (hereinafter, referred to as a "Si substrate") was prepared on which an SiO2 layer of 700 nm was formed.

Figure 6B:
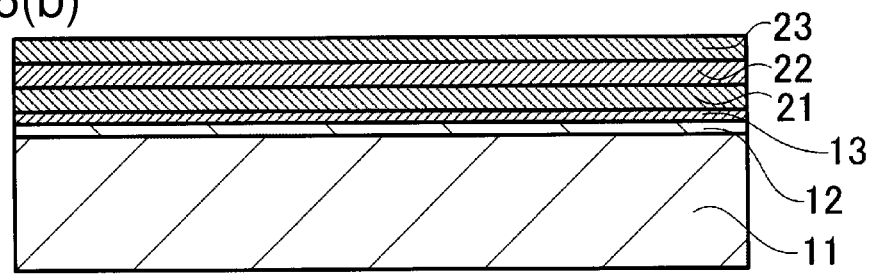

Next, an adhesion layer 13, a lower electrode layer 21, an insulation layer 22, and an upper electrode layer 23 were formed as shown in FIG. 6(b). First, on the substrate 11, a barium strontium titanate ((Ba,Sr)TiO$_3$, hereinafter referred to as a "BST") layer was formed as the adhesion layer 13. Specifically, a raw material solution of a Ba organic compound, a Sr organic compound, and a Ti organic compound mixed so as to have a ratio of Ba:Sr:Ti=70:30:100 (molar ratio) was applied by spin coating onto the upper surface of the Si substrate, and dried at a temperature of 350° C. on a hot plate. Then, an RTA (Rapid Thermal Annealing) treatment was carried out at a rate of temperature increase of 5° C./s, to carry out a heat treatment for 30 minutes under a condition of 650° C. in an oxygen atmosphere. In this way, a BST layer of 90 nm in thickness was formed.

Next, as the lower electrode layer 21, a Pt layer of 300 nm in thickness was formed on the adhesion layer 13 by using a sputtering method.

Next, the insulation layer 22 and the upper electrode layer 23 were formed sequentially. More specifically, a BST layer of 90 nm in thickness was formed on the Pt layer by the same method as in the case of the BST layer described previously. On this BST layer, a Pt layer of 300 nm in thickness was formed by the same method as in the case of the Pt layer described previously.

Figure 6C:
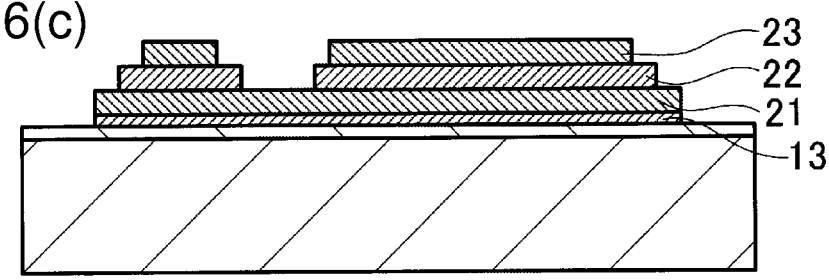

Next, the upper electrode layer 23, the insulation layer 22, the lower electrode layer 21, and the adhesion layer 13 were subjected to patterning as shown in FIG. 6(c). First, the upper electrode layer 23 was subjected to patterning. More specifically, a resist was applied onto the Pt layer to serve as the upper electrode layer 23, and subjected to exposure and development to form a resist pattern. Then, patterning into a predetermined shape was carried out by an Ar ion milling method, and the resist was then removed by asking. The insulation layer 22, the lower electrode layer 21, and the adhesion layer 13 were subjected to patterning by the same method, and the resist was then removed.

Figure 6D:
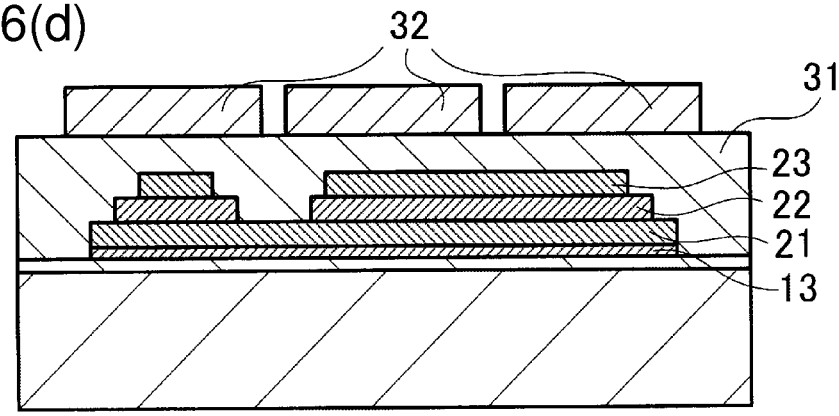

Next, as in FIG. 6(d), an inorganic protective layer 31 was formed so as to cover the upper surfaces and side surfaces of the patterned upper electrode layer 23, insulation layer 22, lower electrode layer 21, and adhesion layer 13. As the inorganic protective layer 31, a SiN$_x$ layer of 300 nm in thickness was formed by sputtering. Then, an organic protective layer 32 was formed on the inorganic protective layer 31. Specifically, a photosensitive polyimide was applied by spin coating, and subjected to exposure, development, and curing to form a polyimide layer of 2 μm in film thickness.

Figure 7E:
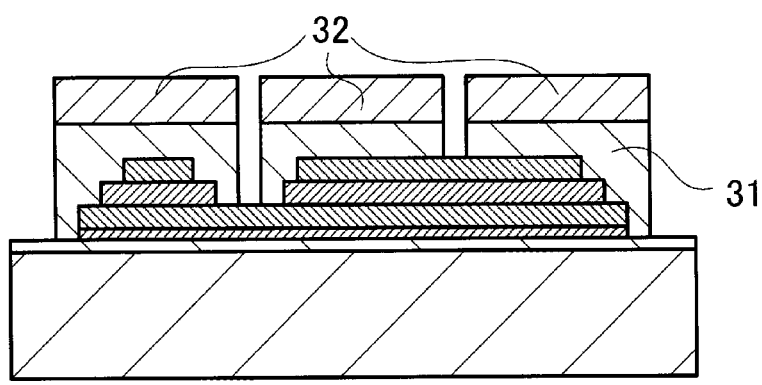
FIGS. 7(e) to 7(g) are cross-sectional views illustrating steps of manufacturing the anti-fuse element according to the present invention. (Experimental Example)

Next, as in FIG. 7(e), with this organic protective layer 32 used as a mask pattern, the inorganic protective layer 31 was subjected to patterning with the use of a CHF$_3$ gas. In this case, the inorganic protective layer 31 was subjected to patterning so as to form an opening.

Figure 7F:
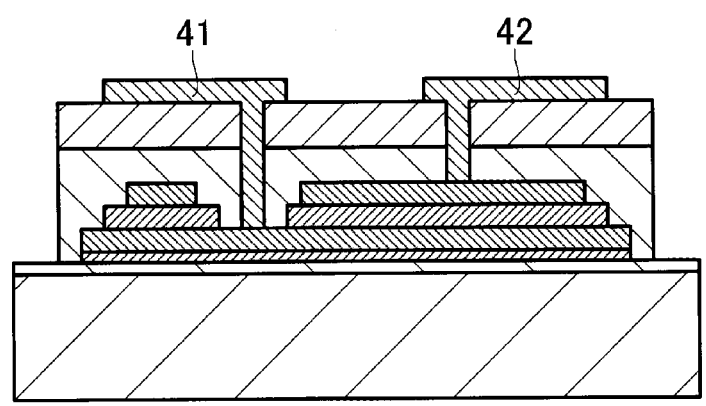

Next, extraction electrodes 41, 42 were formed as in FIG. 7(f). Specifically, a Ti layer (layer thickness: 100 nm) and a Cu layer (layer thickness: 1000 nm) were continuously formed with the use of magnetron sputtering. Then, a resist pattern was formed by sequentially carrying out the application, exposure, and development of a resist. Then, the Cu layer was subjected to patterning by wet etching with the resist pattern as a mask. Subsequently, the Ti layer was subjected to patterning with the use of the resist pattern as it was. Then, the resist pattern was removed.

Figure 7G:
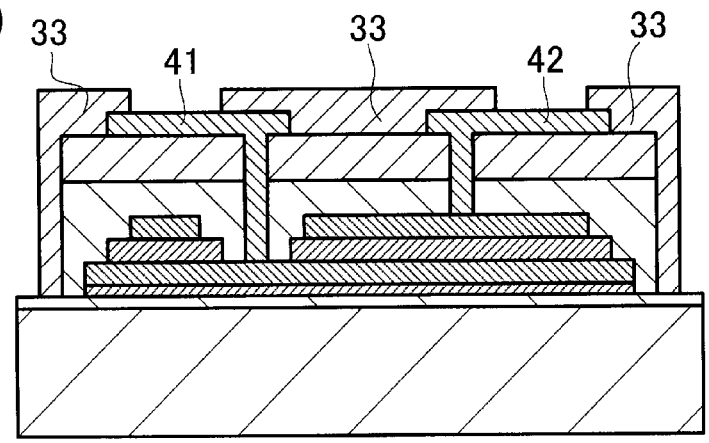
Figure 8A:
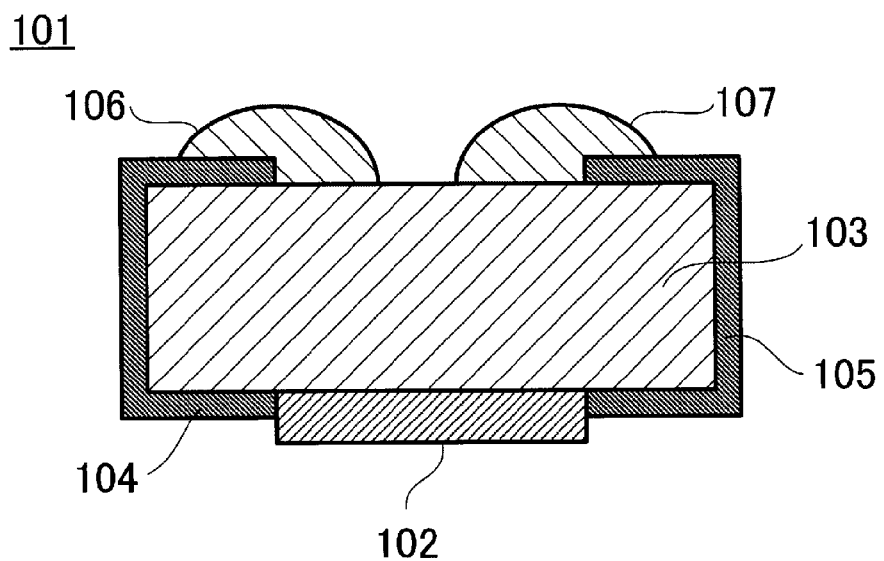
FIGS. 8(a) and 8(b) are cross-sectional views illustrating a conventional anti-fuse element.
Figure 8B:
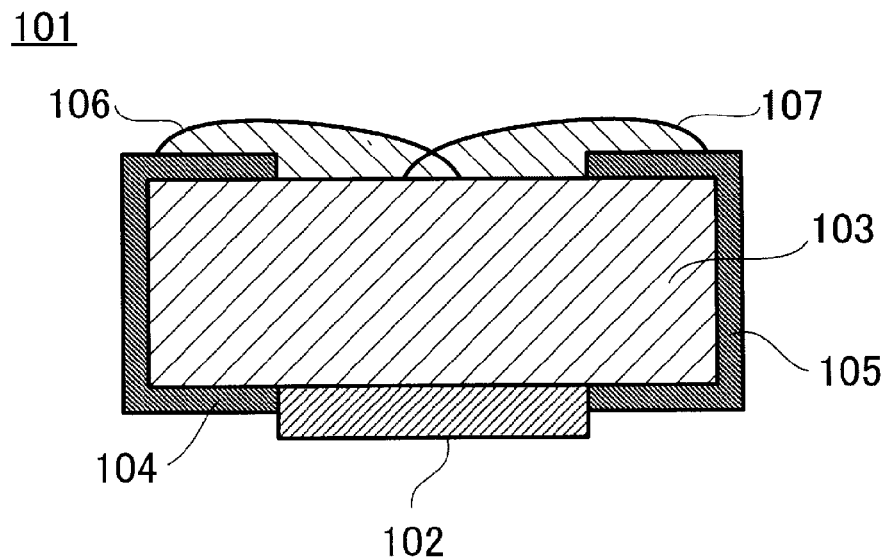

Next, an organic insulation layer 33 was formed so that the external electrodes 41, 42 are partially exposed, as in FIG. 7(g). Specifically, a photosensitive polyimide was applied by spin coating, and subjected to exposure, development, and curing to form a polyimide layer of 2 μm in film thickness.

Then, finally, external electrodes 43, 44 were formed on the exposed sections of the extraction electrodes 41, 42 as shown in FIG. 2. Specifically, a Ni layer of 1 μm in thickness was formed by electrolytic plating in the opening of the resist pattern. An Au layer of 1 μm in thickness was formed thereon. Finally, the substrate was cut with the use of a dicing saw to clip an anti-fuse element in a chip form of 1.0×0.5×0.5 mm.

For the obtained anti-fuse element, the maximum diameter of a structural change section was measured which was produced when the anti-fuse element was short-circuited.

First, a resistor of 10 Ω was connected in series with the anti-fuse element, and a voltage of 25 V was applied to short-circuit the anti-fuse element. It is to be noted that the short-circuited anti-fuse element had a resistance of 1 to 3 Ω, and the electric current flowing into the anti-fuse element is thus considered to be 1.9 to 2.3 A when the voltage is applied.

In this case, the maximum diameter of the structural change section was measured for 19 points under a digital microscope, after the short circuit was caused. Table 1 shows the average value, minimum value, and maximum value among the 19 points, for the measured maximum diameters of the structural change sections.

TABLE 1

| Average [μm] | Minimum [μm] | Maximum [μm] |
|---|---|---|
| 17.9 | 14 | 26 |

It has been determined from Table 1 that the average value for the maximum diameters of the structural change sections is 17.9 μm under the preparation conditions of this time, which falls within the specific range from 14 μm to 26 μm.

Accordingly, the structure provided with multiple connections for each extraction electrode as in FIG. 1 can prevent the generation of a defective open in the short-circuited anti-fuse element. In addition, the distance greater than 26 μm between the connections of the extraction electrode can prevent the generation of a defective open with more certainty.

| DESCRIPTION OF REFERENCE SYMBOLS | |
|---|---|
| 10: | anti-fuse element |
| 11: | substrate |
| 12: | oxide layer |
| 13: | adhesion layer |
| 21: | lower electrode layer |
| 22: | insulation layer |
| 23: | upper electrode layer |
| 24: | crack |
| 25a, 25b, 26a, 26b: | ball |
| 27: | short circuit section |
| 28: | dissipation section |
| 29: | structural change section |
| 30: | protective layer |
| 31: | inorganic protective layer |
| 32: | organic protective layer |
| 33: | organic insulation layer |
| 41, 42: | extraction electrode |
| 41a, 42a: | connection |
| 41b, 42b: | planar section |
| 43, 44: | external electrode |
| 101: | anti-fuse element |
| 102: | resistive element |
| 103: | insulator |
| 104, 105: | terminal |
| 106, 107: | low melting point conductor |

The invention claimed is:

1. An anti-fuse element comprising:
   an insulation layer having opposed first and second surfaces;
   a first electrode layer on the first surface of the insulation layer;
   a second electrode layer on the second surface of the insulation layer; and
   an extraction electrode having two or more sections contacting a section of at lease one of the first and second electrode layers that form electrostatic capacitance with the insulation layer,
   wherein the anti-fuse element is configured to create a structural change section when a voltage not less than a breakdown voltage of the insulation layer is applied, the structural change section including at least one short circuit section wherein the first and second electrode layers are fused mutually to engulf the insulation layer, and a dissipation section with the first and second electrode layers and insulation layer dissipated by the engulfing of the insulation layer, and
   wherein the insulation layer includes $(Ba,Sr)TiO_3$, and the first and second electrode layers include a metal or an alloy thereof including at least one element selected from the group consisting of Au, Ag, Pt, Pd, Rh, Ir, Ru, and Os.

2. The anti-fuse element according to claim 1, a distance between the two or more sections of the extraction electrode is larger than a maximum diameter of the structural change section.

3. The anti-fuse element according to claim 2, wherein the maximum diameter of the structural change section is in a range of 14 μm to 26 μm.

4. The anti-fuse element according to claim 1, further comprising a protective layer covering the insulation layer and the first and second electrode layers.

5. The anti-fuse element according to claim 4, wherein the two or more sections of the extraction electrode are connected to the at lease one of the first and second electrode layers through the protective layer, and the extraction electrode also includes a planar section on the protective layer.

6. The anti-fuse element according to claim 5, wherein the protective layer includes an inorganic protective layer and an organic protective layer.

7. The anti-fuse element according to claim 6, wherein a material of the inorganic protective layer is selected from the group consisting of $SiN_x$, $SiO_2$, $Al_2O_3$, and $TiO_2$.

8. The anti-fuse element according to claim 6, wherein material of the organic protective layer is selected from the group consisting of polyimide resin and epoxy resin.

9. The anti-fuse element according to claim 4, further comprising an organic insulation layer covering the protective layer.

10. The anti-fuse element according to claim 1, further comprising:
    a substrate; and
    an external electrode electrically connected to the extraction electrode,
    wherein the insulation layer, the first and second electrode layers, and the external electrode are on a surface of the substrate.

* * * * *